(12) United States Patent
Lee

(10) Patent No.: US 10,672,341 B2
(45) Date of Patent: Jun. 2, 2020

(54) ORGANIC LIGHT EMITTING DIODE DISPLAY DEVICE

(71) Applicant: LG DISPLAY CO., LTD., Seoul (KR)

(72) Inventor: Wan-Yun Lee, Uijeongbu-si (KR)

(73) Assignee: LG DISPLAY CO., LTD., Seoul (KR)

( * ) Notice: Subject to any disclaimer, the term of this patent is extended or adjusted under 35 U.S.C. 154(b) by 54 days.

(21) Appl. No.: 16/059,566

(22) Filed: Aug. 9, 2018

(65) Prior Publication Data

US 2019/0066594 A1 Feb. 28, 2019

(30) Foreign Application Priority Data

Aug. 29, 2017 (KR) .................. 10-2017-0109385

(51) Int. Cl.
*G09G 3/3258* (2016.01)
*G09G 3/3291* (2016.01)
*H01L 27/32* (2006.01)
*G09G 3/3225* (2016.01)

(52) U.S. Cl.
CPC ......... *G09G 3/3258* (2013.01); *G09G 3/3225* (2013.01); *G09G 3/3291* (2013.01); *H01L 27/3244* (2013.01); *G09G 2300/0819* (2013.01); *G09G 2310/08* (2013.01); *G09G 2320/0223* (2013.01); *G09G 2330/021* (2013.01); *G09G 2330/028* (2013.01)

(58) Field of Classification Search
CPC combination set(s) only.
See application file for complete search history.

(56) References Cited

U.S. PATENT DOCUMENTS

| 7,685,253 B1* | 3/2010 | Valia ..................... H04L 67/34 709/203 |
| 2013/0169697 A1* | 7/2013 | Park ..................... G09G 3/2003 345/690 |
| 2017/0006688 A1* | 1/2017 | Dai ........................ G09G 3/3208 |
| 2018/0293946 A1* | 10/2018 | Li ......................... G09G 3/3406 |

* cited by examiner

*Primary Examiner* — Temesghen Ghebretinsae
*Assistant Examiner* — Sosina Abebe
(74) *Attorney, Agent, or Firm* — Birch, Stewart, Kolasch & Birch, LLP

(57) ABSTRACT

An organic light emitting diode (OLED) display device for monitoring a driving voltage supplied to an OLED display panel from a set unit and generating a compensation voltage and transmitting the compensation voltage to a display panel when voltage drop occurs is discussed. The OLED display device includes a power supply unit of a set unit configured to supply a voltage for driving an OLED of a panel unit, a cable configured to transmit the voltage supplied from the power supply unit of the set unit to the panel unit, and a control circuit unit comprising a voltage adjustment module configured to compare the voltage transmitted through the cable with a target voltage and to generate a voltage with an amplitude corresponding to a difference.

6 Claims, 8 Drawing Sheets

(A)　　　　　　　　(B)

ORGANIC LIGHT EMITTING DIODE DISPLAY DEVICE

CROSS-REFERENCE TO RELATED APPLICATION

This application claims the priority benefit of Korean Patent Application No. 10-2017-0109385, filed in the Republic of Korea on Aug. 29, 2017, which is hereby incorporated by reference as if fully set forth herein.

BACKGROUND OF THE INVENTION

Field of the Invention

The present invention relates to an organic light emitting diode (OLED) display device, and more particularly, an OLED display device for monitoring a driving voltage supplied to a display panel from a set unit and generating a compensation voltage and transmitting the compensation voltage to the display panel when the driving voltage drop occurs.

Discussion of the Related Art

A recent representative example of a display device that displays an image using digital data is a liquid crystal display (LCD) using liquid crystals, an organic light emitting diode (OLED) display device using OLEDs, and an electrophoretic display (EPD) using electrophoretic particles.

Among these devices, the OLED display device is a self-emissive device that emits light from an organic light emitting layer via the recombination of electrons and holes, has high brightness and a low driving voltage and is ultra-thin and, thus, has been expected as the next-generation display device.

Each sub pixel of the OLED display device includes an OLED device and a pixel circuit that independently drives the corresponding OLED device. The pixel circuit adjusts current for driving the OLED device by a driving thin film transistor (TFT) depending on a driving voltage corresponding to a data signal to adjust the brightness of the OLED device.

FIG. 1 is a diagram showing an example of a case in which an OLED display device is used according to a related art. As shown in (A) of FIG. 1, a driving voltage for driving an OLED device is transmitted to a display panel 3 from a cassette unit 1 through a cable 2. As shown in (B) of FIG. 1, as necessary, an extension cable 2a can be used; however, a voltage drop occurs due to the length of the extension cable 2a that has been extended. Accordingly, a driving voltage applied to the OLED device in the display panel can be dropped which reduces brightness. Accordingly, to compensate for such a voltage drop, an applied voltage needs to be increased. However, the rise in the applied voltage acts as a stress of a power source component, thereby reducing the lifespan of the OLED display device. If the thickness of the cable 2, 2a is increased to compensate for the driving voltage drop, the driving voltage drop may be lowered. However, when the thickness of the cable 2, 2a is increased, although the driving voltage drop may be reduced, it is disadvantageous in that design quality is degraded and the degree of flexibility freedom is degraded due to the increase in the cable thickness of a set unit.

It is possible to use a method of increasing an output voltage by a set unit in consideration of the increased resistance as the length of the cable extends. This method, however, has a problem in terms of overvoltage when the driving environment is changed from an environment in which an extending cable is re-used to a general installation environment.

SUMMARY OF THE INVENTION

An object of the present invention is to provide an organic light emitting diode (OLED) display device for preventing reduction in the brightness of a display panel due to a voltage drop in a driving voltage applied to the display panel.

Another object of the present invention is to provide an OLED display device for generating a compensation voltage corresponding to a voltage drop in a driving voltage applied to a display panel and providing the compensation voltage.

Another object of the present invention is to provide an OLED display device for applying a target voltage used to drive an OLED while the thickness of a cable for transmitting power to a panel unit from a set unit is maintained at the same or similar level.

Additional advantages, objects, and features of the invention will be set forth in part in the description which follows and in part will become apparent to those having ordinary skill in the art upon examination of the following or may be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting diode (OLED) display device includes a power supply unit of a set unit configured to supply a voltage for driving an OLED of a panel unit, a cable configured to transmit the voltage supplied from the power supply unit of the set unit to the panel unit, and a control circuit unit comprising a voltage adjustment module configured to compare the voltage transmitted through the cable with a reference voltage and to generate a voltage with an amplitude corresponding to a difference between the compared voltages.

The voltage adjustment module can include a comparator configured to compare the target voltage and the voltage transmitted through the cable, and a regulator connected to an upper side line of the voltage supplied through the cable in series and configured to generate a voltage corresponding to the difference with the target difference depending on output of the comparator and to add the generated voltage to the voltage transmitted through the cable.

The regulator can be a buck regulator.

A lower side line of the voltage supplied to the cable can supply a base voltage of the target voltage and the regulator can generate a voltage corresponding to a difference between the target voltage and the base voltage.

The power supply unit of the set unit can include an upper transformer connected to the upper side line and a lower transformer connected to the lower side line, and the base voltage can be output through a power tap of the lower transformer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
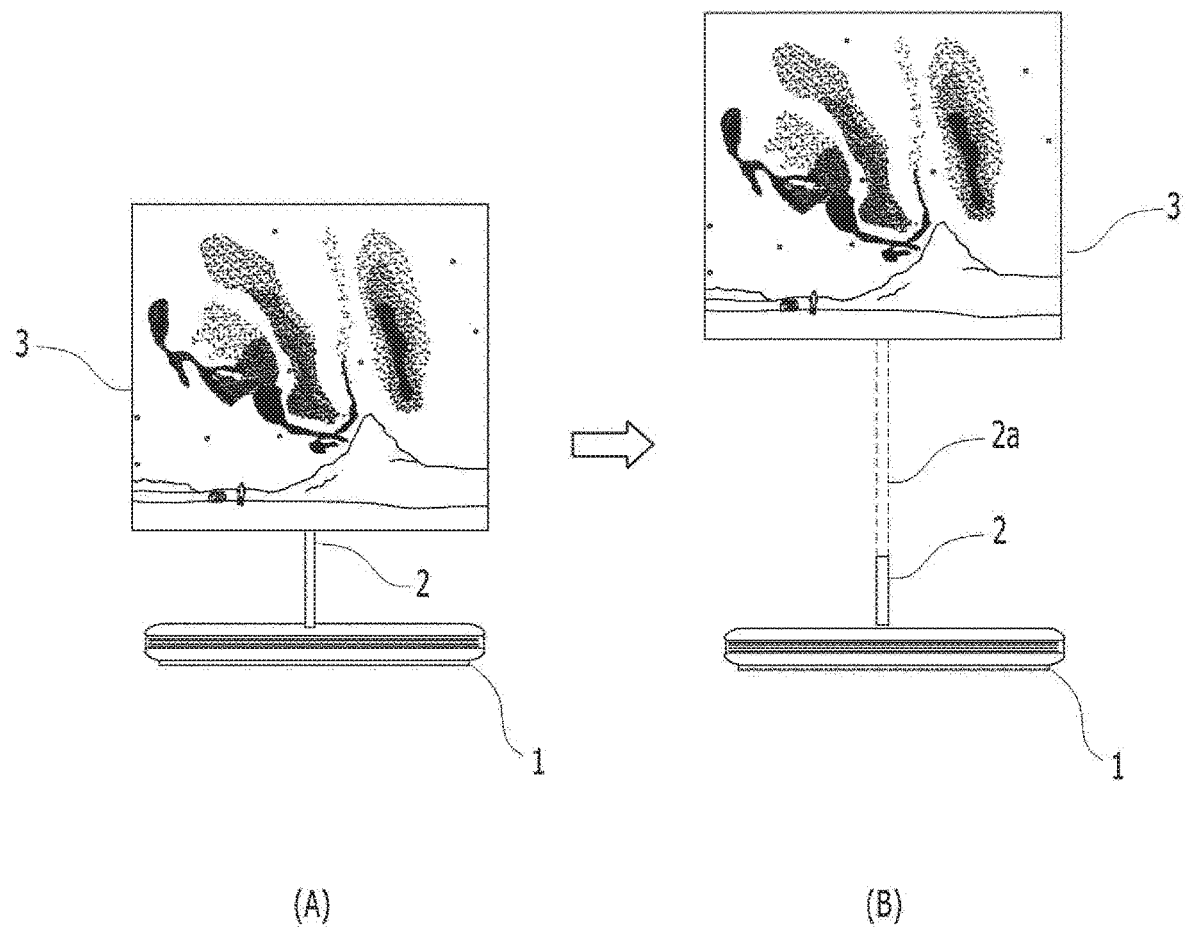
FIG. 1 is a diagram showing an example of the case in which an organic light emitting diode (OLED) display device is used according to a related art.

In embodiments of the present invention disclosed in the specification, specific structural and functional descriptions are merely illustrated for the purpose of illustrating embodiments of the invention and exemplary embodiments of the present invention can be embodied in many forms and are not limited to the embodiments set forth herein.

The embodiments of the present invention can be variously changed and embodied in various forms, in which illustrative embodiments of the invention are shown. However, exemplary embodiments of the present invention should not be construed as being limited to the embodiments set forth herein and any changes, equivalents or alternatives which are within the spirit and scope of the present invention should be understood as falling within the scope of the invention It will be understood that although the terms first, second, third etc. can be used herein to describe various elements, these elements should not be limited by these terms. These terms are only used to distinguish one element from another element. For example, a first element can be termed a second element and a second element can be termed a first element without departing from the teachings of the present invention.

It will be understood that when an element, such as a layer, a region, or a substrate, is referred to as being "on", "connected to" or "coupled to" another element, it can be directly on, connected or coupled to the other element or intervening elements can be present. In contrast, when an element is referred to as being "directly on," "directly connected to" or "directly coupled to" another element or layer, there are no intervening elements or layers present. Other words used to describe the relationship between elements or layers should be interpreted in a like fashion, e.g., "between," versus "directly between," "adjacent," versus "directly adjacent," etc.

The terms used in the present specification are used for explaining a specific exemplary embodiment, not limiting the present inventive concept. Thus, the singular expressions in the present specification include the plural expressions unless clearly specified otherwise in context. Also, terms such as "include" or "comprise" can be construed to denote a certain characteristic, number, step, operation, constituent element, or combination thereof, but can not be construed to exclude the existence of or possibility of addition of one or more other characteristics, numbers, steps, operations, constituent elements, or combinations thereof.

Unless otherwise defined, all terms including technical and scientific terms used herein have the same meaning as commonly understood by one of ordinary skill in the art to which this inventive concept pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When exemplary embodiments are embodied in various ways, a function or operation stated in a specific block can be executed in a different way from an order stated in a flowchart. For example, two consecutive blocks can be substantially simultaneously executed and can be reversely executed according to a related function or operation.

Hereinafter, various embodiments of the present invention will be described with reference to the appended drawings.

Figure 2:
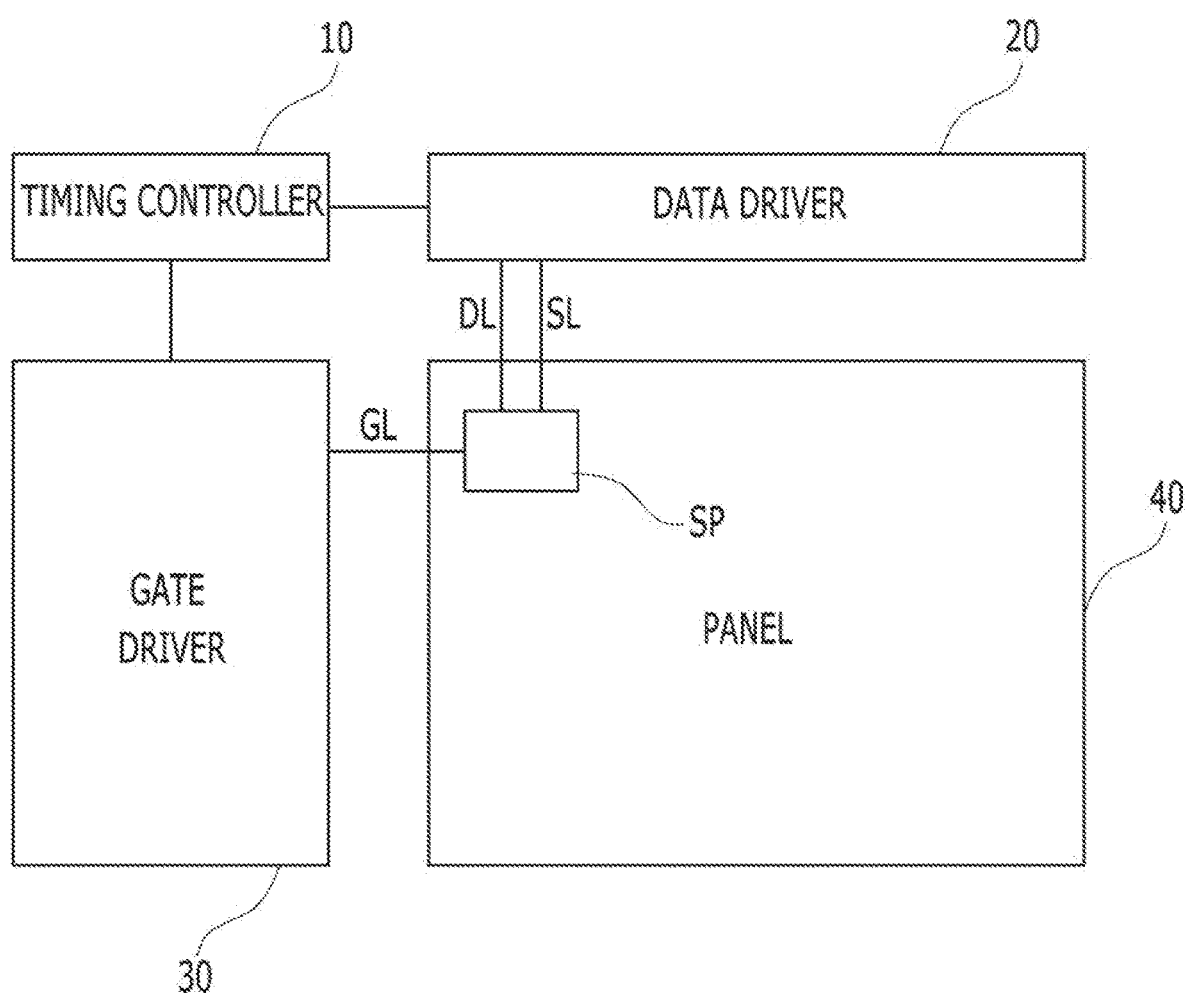
FIG. 2 is a diagram showing a configuration of an OLED display device according to an embodiment of the present invention.

FIG. 2 is a diagram showing a configuration of an organic light emitting diode (OLED) display device according to an embodiment of the present invention. All the components of the OLED display device according to all embodiments of the present invention are operatively coupled and configured.

Referring to FIG. 2, the OLED display device can include a timing controller 10, a data driver 20, a gate driver 30, a panel 40 (e.g., display panel), and so on. The panel 40 can include a plurality of data lines DLs, a plurality of gate lines GLs, and a plurality of sensing lines SLs, which are arranged thereon, and a plurality of pixels SPs arranged thereon and connected to the data lines DLs, the gate liens GLs, and the sensing lines SLs.

The gate driver 30 can supply a scan signal of a turn-on voltage or a turn-off voltage to the gate line GL according to control of the timing controller 10. When the scan signal of the turn-on voltage is supplied to the pixel SP, the corresponding pixel SP can be connected to the data line DL and, when the scan signal of the turn-off voltage is supplied to the pixel SP, connection between the corresponding pixel SP and the data line DL can be released.

The data driver 20 can supply a data voltage to the data line DL. The data voltage supplied to the data line DL can be supplied to the pixel SP connected to the data line DL according to the scan signal. The data driver 20 can receive image data from the timing controller 10 and, in this case, can convert the image data to generate a data voltage.

The timing controller 10 can supply various control signals to the data driver 20 and the gate driver 30. The timing controller 10 can begin scanning according to timing embodied in each frame and convert image data input from the outside according to data signal format used in the data driver 20. The timing controller 10 can output the converted image data to the data driver 20 and control the data driver 20 at an appropriate time corresponding to scanning.

The timing controller 10, the data driver 20, and the gate driver 30 can each include one or more integrated circuits (ICs). For example, the data driver 20 can include at least one source driver integrated circuit (SDIC).

At least two components of the timing controller 10, the data driver 20, or the gate driver 30 can be configured as one IC. For example, the timing controller 10 and the data driver 20 can be configured as one IC.

The timing controller 10, the data driver 20, and the gate driver 30 can be embodied in different forms and, for example, some functions of the data driver 20 and the timing controller 10 can be embodied as one IC and the other functions of the data driver 20 can be embodied as a separate IC.

Figure 3:
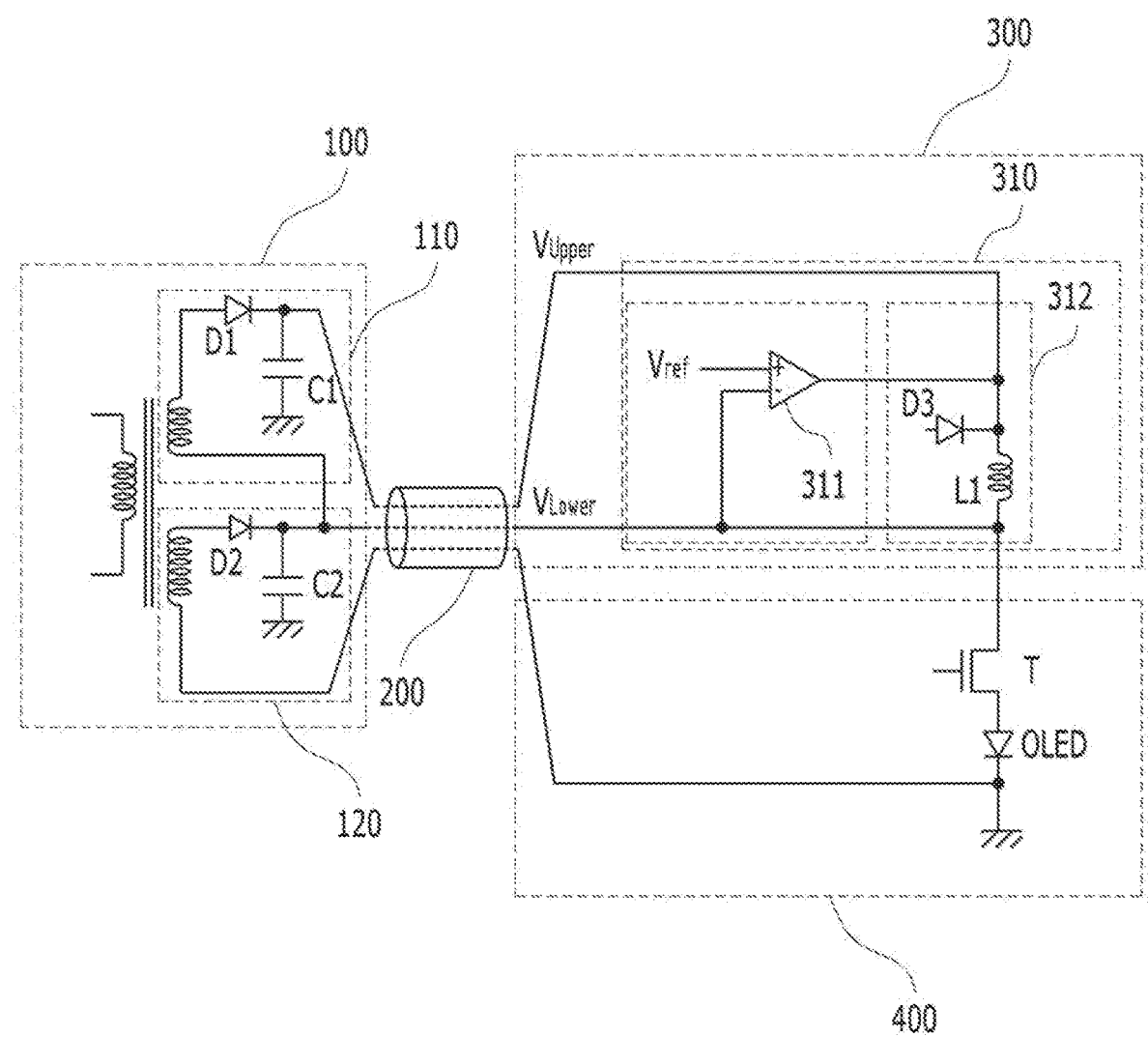
FIG. 3 is a diagram showing an example of a power source unit of an OLED display device according to an embodiment of the present invention.

FIG. 3 is a diagram showing an example of a power source unit of an OLED display device according to an embodiment of the present invention.

Referring to FIG. 3, the configuration of the power source unit can include a power supply unit 100 of a set unit for supplying a voltage for driving an OLED of a panel unit 400 (e.g., panel 40), a cable 200 for transmitting a voltage supplied from the set unit 100 to the panel unit 400, and a control circuit unit 300 including a voltage adjustment module 310 for comparing a voltage transmitted through the cable 200 with a target voltage to generate a voltage with an amplitude corresponding to the difference.

The power supply unit 100 of the set unit can include an upper transformer 110 and a lower transformer 120. The upper transformer 110 can include a smoothing unit including a diode D1 and a capacitor C1. The lower transformer 120 can include a smoothing unit including a diode D2 and a capacitor C2. One end of the upper transformer 110 may be connected to an output end of the lower transformer 120.

The control circuit unit 300 can refer to a circuit board including a timing controller. When a voltage supplied from the power supply unit 100 of the set unit is dropped, the voltage adjustment module 310 can generate a compensation voltage to compensate for the voltage with a voltage DVDD for driving the OLED.

The voltage adjustment module 310 can include a comparator 311 and a regular 312. The comparator 311 compares a voltage ($V_{Lower}$) transmitted through the cable 200 with a target voltage Vref. The regulator 312 that is connected to an upper side line of a voltage ($V_{Upper}$) supplied through the cable 200 generates a voltage corresponding to a difference with the target voltage Vref according to the output of the comparator 311, and adds the generated voltage to the voltage transmitted through the cable 200.

The regulator 312 can include a buck regulator.

Figure 4:
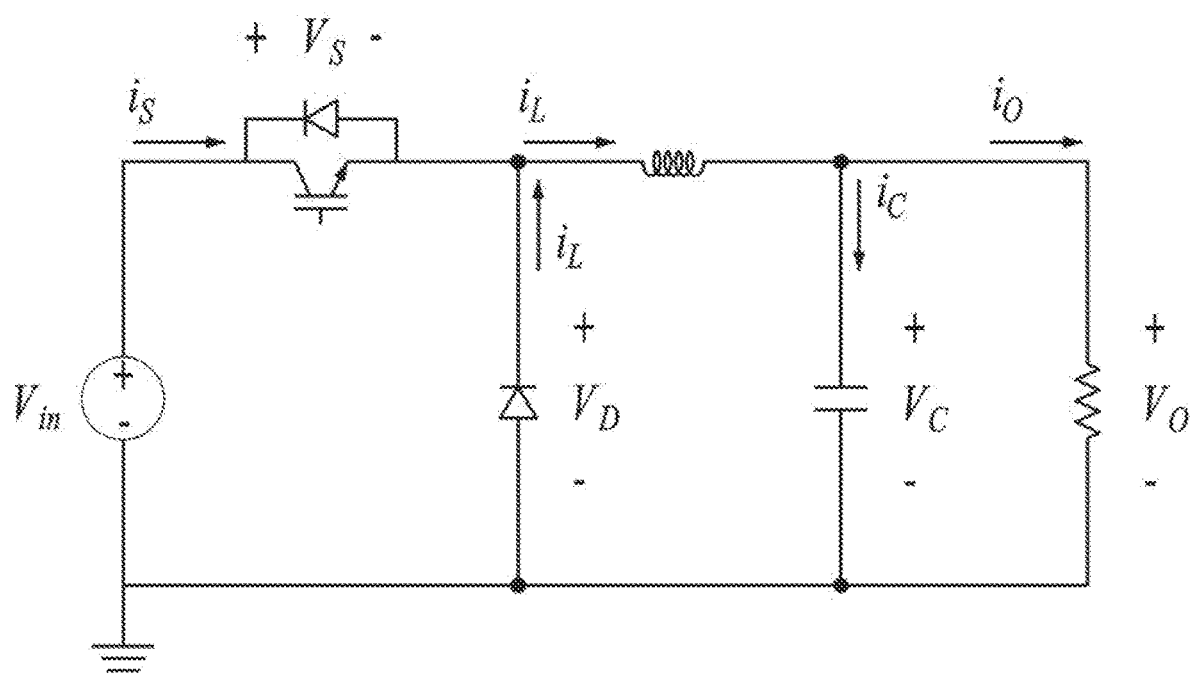
FIG. 4 is a diagram showing an example of a function of a voltage adjustment module of an OLED display device according to an embodiment of the present invention.

FIG. 4 is a diagram showing an example of a configuration of such a buck regulator that can function as a voltage adjustment module (e.g., the voltage adjustment module 310) in an OLED display device according to an embodiment of the present invention. According to the embodiment of the present invention, the OLED display device can include a buck regulator for varying a duty of a turn-on or turn-off time to vary a voltage. That is, the OLED display device can include a Free Wheeling Diode including a coil, a diode, and a capacitor and allowing energy stored in a coil to reversely flow in a turn-off state. According to the present invention, the characteristics of the buck regulator can be used.

Figure 5A:
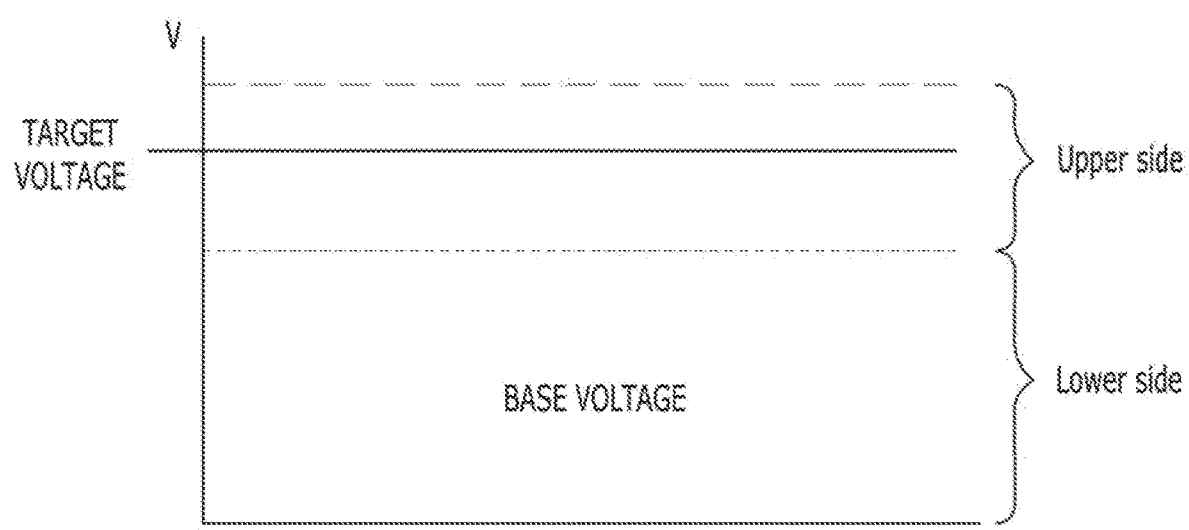
FIGS. 5A and 5B are diagrams showing an example of an effect from an operation of a voltage adjustment module of an OLED display device according to the present invention.
Figure 5B:
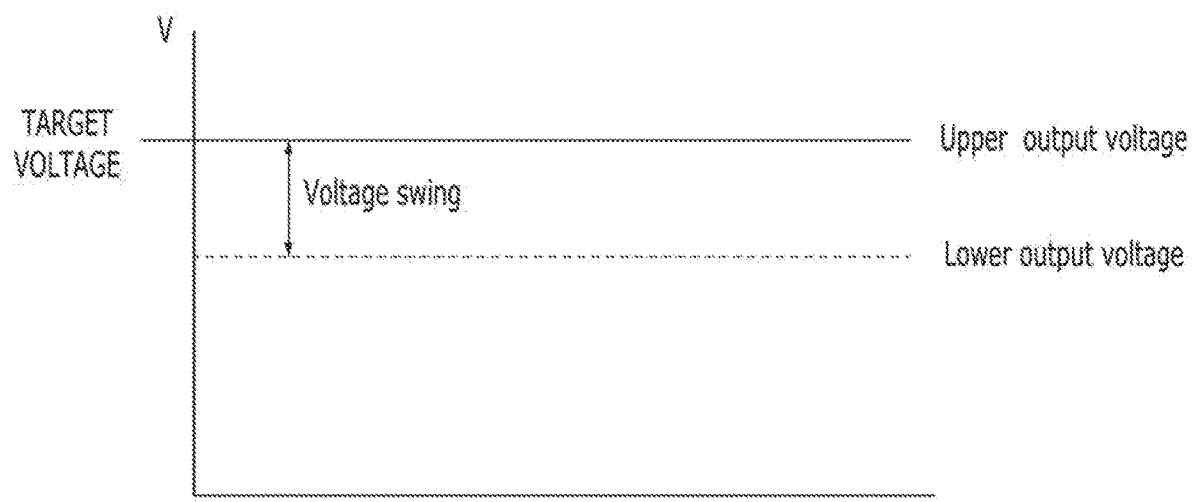

FIGS. 5A and 5B are diagrams showing an effect according to an operation of a voltage adjustment module (e.g., the voltage adjustment module 310) of an OLED display device according to an example of the present invention.

As shown in FIG. 5A, a voltage can contain a lower side voltage and an upper side voltage. A lower side voltage $V_{Lower}$ of the voltage can be transmitted from the lower transformer 120 of the set unit 100 through a cable and can function as a base voltage of a target voltage. A voltage output from the upper transformer 110 of the set unit 100 can be transmitted to an upper side voltage $V_{Upper}$.

When the length of the cable is increased, a voltage output from the set unit is transmitted to the display panel and, in this case, the voltage can be dropped. That is, the set unit 100 can output an operating voltage of 24 V to operate an OLED and, in this regard, when the length of the cable is increased, the voltage of the display panel can be frequently dropped to various values of 18 V or 20 V.

Accordingly, according to an embodiment of the present invention, a voltage required for an operation of an OLED can be determined as a reference voltage or a target voltage. That is, a voltage adjustment module can be connected to an existing power supply wiring in series to generate a voltage corresponding to a difference between the target voltage and the voltage transmitted through the cable and, thus, the OLED can be normally driven.

For example, as shown in FIG. 5B, a lower side voltage of a voltage transmitted from a lower transformer of the set unit can be used as a base voltage and a voltage transmitted through the upper transformer 110 can be swung to reach the target voltage.

The set unit 100 can output an operating voltage of 12 V required to drive an IC included in a control circuit unit, a data driver, and a gate driver and, in this regard, the same configuration can also be applied to such a voltage supply line to supply a voltage of 12 V to allow the control circuit unit, the data driver, and the gate driver to normally operate. That is, an EVDD voltage for driving the OLED can use 24 V set as a target voltage and a VDD voltage for an operation of an IC used in a plurality of circuit boards can use 12 V as a target voltage. Needless to say, the above voltage adjustment module can be arranged in the same configuration even in a supply line of 12 V and the operation can also be performed in the same way as the EVDD voltage adjustment module.

Figure 6A:
FIGS. 6A and 6B are diagrams showing an example of an operation of a voltage adjustment module of an OLED display device according to the present invention.
Figure 6B:

FIGS. 6A and 6B are diagrams showing an example of an operation of a voltage adjustment module (e.g., the voltage adjustment module 310) of an OLED display device according to the present invention.

First, in the embodiment shown in FIG. 6A, a power output unit of the set unit 100 can output 24 V required to drive an OLED. A voltage supplied to a display panel through the cable 200 can be dropped to 20 V. According to the present invention, the target voltage can be reached using the voltage as a base voltage. That is, 24 V as a target voltage (reference voltage) can be applied to a non-inverting terminal (+) of the comparator 311. A lower voltage can be applied to an inverting terminal of the comparator 311. A feedback circuit time constant of the regulator 312 can be set to a target voltage, i.e., 24 V and, thus, the comparator 311 can output a difference value between a target voltage 24 V and a lower side voltage 20 V and the regulator 312 can generate 4 V as the difference value. The regulator 312 can be connected to a driving voltage (EVDD) supply terminal of the OLED in series. Accordingly, the target voltage 24 V obtained by summing a voltage of 4 V generated by the regulator and 20 V as the lower side voltage $V_{Lower}$ can be applied to the OLED.

As shown in FIG. 6B, when a lower voltage is 18 V, a voltage of 18 V can be transmitted to the inverting terminal (−) of the comparator 311. The comparator 311 can output 6 V as a difference value with a target voltage 24V. A feedback circuit time constant of the regulator 312 can be set to a target voltage, i.e., 24 V and, thus, the regulator 312 can generate 6 V as a difference value and transmit a voltage 24 V added to the lower side voltage 18 V to the OLED.

Thus far, although the case in which the length of a cable extends and a voltage drop occurs due to the resistance of the cable has been described, in the present invention when the length of the cable is reduced, a voltage transmitted through the cable is fed back to a comparator of a voltage adjustment module and is compared with a target voltage and, thus, a VDD voltage and an EVDD voltage as a target voltage required for an IC circuit of each of an OLED and each circuit unit can be provided using the operating characteristics of the regulator.

The OLED display device according to various embodiments of the present invention can have the following advantages and effects.

First, a voltage drop during a long-distance driving can be prevented or minimized using a base voltage and a generated voltage.

Second, even if a cable extends, an OLED display panel can be driven using a cable with an identical thickness.

Third, even if the length of a cable is increased or reduced, a voltage used in a display module unit of the OLED display device can be provided in constant amplitude.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. An organic light emitting diode (OLED) display device comprising:
   a power supply unit of a set unit configured to supply a voltage for driving an OLED of a panel unit;
   a cable configured to transmit the voltage supplied from the power supply unit of the set unit to the panel unit; and
   a control circuit unit comprising a voltage adjustment module configured to compare the voltage transmitted through the cable with a target voltage and to generate a voltage with an amplitude corresponding to a difference between the compared voltages,
   wherein the voltage adjustment module comprises:
   a comparator configured to compare the target voltage and the voltage transmitted through the cable; and
   a regulator connected to an upper side line of a voltage line of the cable in series, and configured to generate a voltage corresponding to the difference with the target voltage based on an output of the comparator and to add the generated voltage to the voltage transmitted through the cable.

2. The OLED display device of claim 1, wherein the regulator is a buck regulator.

3. The OLED display device of claim 1, wherein a lower side line of a voltage line of the cable supplies a base voltage of the target voltage, and the regulator generates a voltage corresponding to a difference between the target voltage and the base voltage.

4. The OLED display device of claim 3, wherein the power supply unit of the set unit comprises an upper transformer connected to the upper side line and a lower transformer connected to the lower side line, and
   wherein the base voltage is output through a power tap of the lower transformer.

5. The OLED display device of claim 1, wherein the power supply unit of the set unit comprises an upper transformer and a lower transformer, and
   wherein an end of the upper transformer is connected to an output end of the lower transformer.

6. An organic light emitting diode (OLED) display device comprising:
   a power supply unit of a set unit configured to supply a voltage for driving an OLED of a panel unit;
   a cable configured to transmit the voltage supplied from the power supply unit of the set unit to the panel unit; and
   a control circuit unit comprising a voltage adjustment module configured to compare the voltage transmitted through the cable with a target voltage and to generate a voltage with an amplitude corresponding to a difference between the compared voltages,
   wherein the power supply unit of the set unit comprises an upper transformer and a lower transformer, and
   wherein an end of the upper transformer is connected to an output end of the lower transformer.

* * * * *